(12) United States Patent
Kakiage

(10) Patent No.: US 6,530,856 B1
(45) Date of Patent: Mar. 11, 2003

(54) ELECTRONIC CONTROL APPARATUS FOR VEHICLE

(75) Inventor: Kenji Kakiage, Gunma (JP)

(73) Assignee: Unisia Jecs Corporation, Atsugi (JP)

( * ) Notice: Subject to any disclaimer, the term of this patent is extended or adjusted under 35 U.S.C. 154(b) by 0 days.

(21) Appl. No.: 09/852,771

(22) Filed: May 11, 2001

(30) Foreign Application Priority Data

Jun. 28, 2000 (JP) ........................................ 2000-195062

(51) Int. Cl.⁷ .......................... F16H 31/00; F16H 57/02
(52) U.S. Cl. .................................... 475/123; 74/606 R
(58) Field of Search ........................... 475/123; 477/52, 477/97; 74/606 R, DIG. 1

(56) References Cited

U.S. PATENT DOCUMENTS

| | | | | |
|---|---|---|---|---|
| 4,083,266 A | * | 4/1978 | Kreitzberg | ................. 74/337.5 |
| 4,271,728 A | * | 6/1981 | Wakamatsu | .................. 477/34 |
| 4,805,490 A | * | 2/1989 | Fuehrer et al. | ............ 74/606 R |
| 5,311,398 A | * | 5/1994 | Schirmer et al. | .......... 174/52.2 |
| 5,361,650 A | * | 11/1994 | Klecker et al. | ............ 174/52.2 |
| 5,662,007 A | | 9/1997 | Stärker et al. | ............. 74/606 A |
| 5,830,106 A | * | 11/1998 | Abe | ........................... 477/906 |
| 5,845,544 A | * | 12/1998 | Huggins et al. | ............... 74/335 |
| 6,160,708 A | * | 12/2000 | Loibl et al. | .................. 174/266 |
| 6,164,160 A | * | 12/2000 | Nassar | ......................... 29/840 |

FOREIGN PATENT DOCUMENTS

| | | | | |
|---|---|---|---|---|
| JP | 8-510317 | | 10/1996 | |
| JP | 410151954 | * | 9/1998 | ........... B60K/20/00 |
| JP | 411063219 | * | 3/1999 | ........... F16H/63/02 |

* cited by examiner

Primary Examiner—Sherry Estremsky
Assistant Examiner—Tisha D. Lewis
(74) Attorney, Agent, or Firm—Foley & Lardner

(57) ABSTRACT

Between a control unit such as a control unit for an automatic transmission and a mounting bracket, there is provided an interconnection integrated insulating sheet including a plurality of buried interconnection patterns for connecting the control unit with associated components, such as oil sensors and connectors for solenoid valves, mounted on the bracket. The control unit is mounted on the insulating sheet and enclosed by a protective cover mounted on the insulating sheet. The insulating sheet is overlapped on the mounting bracket and the mounting bracket is fixed to a control valve of an automatic transmission together with the insulating sheet.

15 Claims, 9 Drawing Sheets

ELECTRONIC CONTROL APPARATUS FOR VEHICLE

BACKGROUND OF THE INVENTION

The present invention relates to an electronic control system or apparatus preferably employed for controlling an engine or an automatic transmission for a vehicle.

A published Japanese patent application Publication (Kohyo) No. H08(1996)-510317 shows a conventional electronic shift control system for an automatic transmission of a vehicle.

SUMMARY OF THE INVENTION

In the control system of the above-mentioned publication, a control unit is connected with associated components such as oil sensors and solenoid valves by a plurality of leads. This arrangement requires a relatively large connector for connecting the control unit with multiple leads and a mounting portion for the connector, renders the circuitry congested around the control unit, increases the size of the system, complicates the assembly process, and increases the number of required component parts.

It is therefore an object of the present invention is to provide an electronic control apparatus or system having a simple connecting structure which can reduce the number of component parts, reduce the size of the system, facilitate the assembly, and improve the reliability of the system.

According to the present invention, an electronic control apparatus for a vehicle comprises: a control unit; a plate-shaped bracket adapted to be fixed to a vehicle; and an insulating sheet interposed between the bracket and the control unit. The insulating sheet comprises a plurality of interconnection patterns connected with the control unit.

The other objects and features of this invention will become understood from the following description with reference to the accompanying drawings.

The other objects and features of this invention will become understood from the following description with reference to the accompanying drawings.

DETAILED DESCRIPTION OF THE INVENTION

Figure 1:
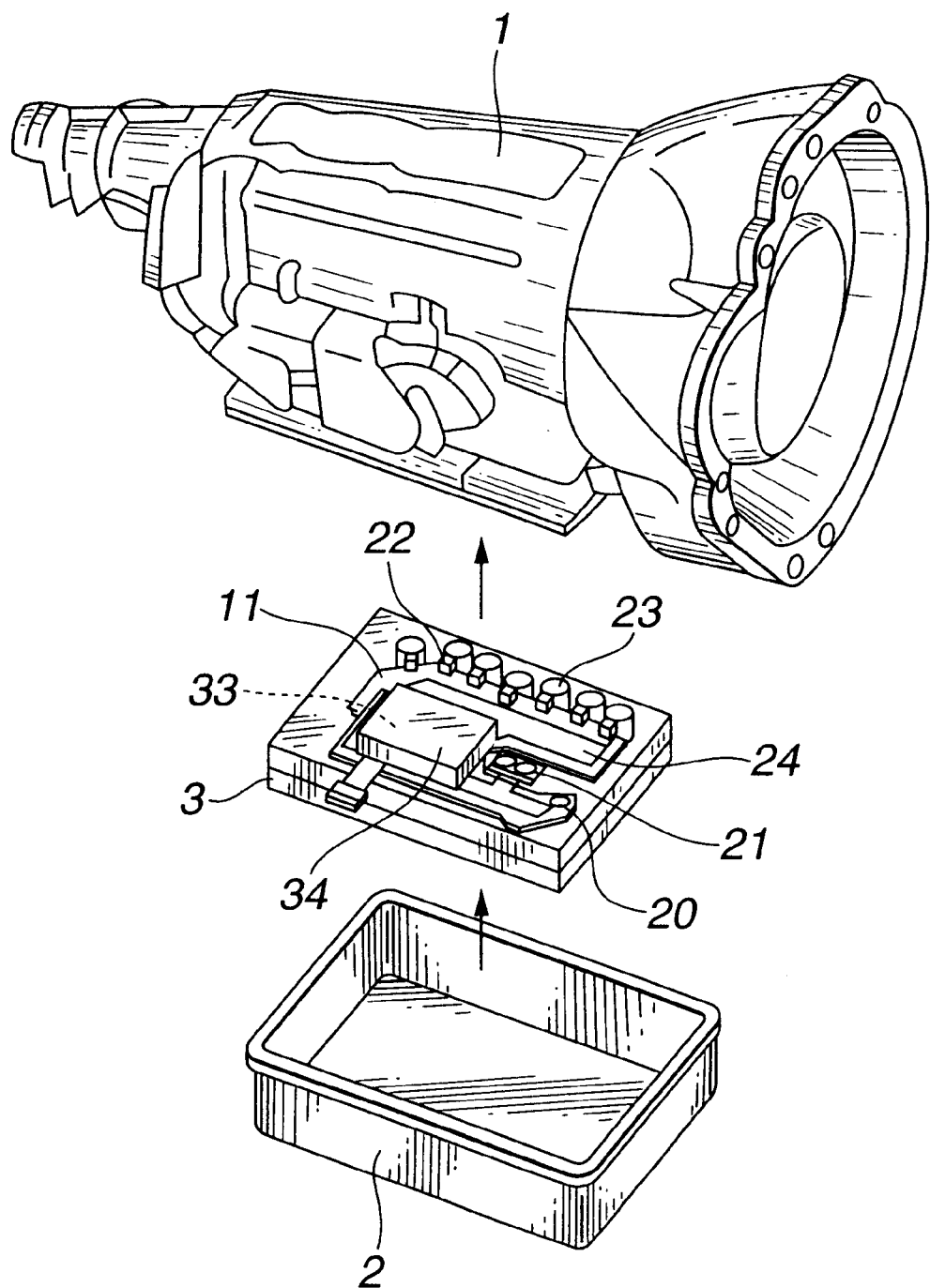
FIG. 1 is an exploded perspective view showing an automatic transmission including a control apparatus a according to a first embodiment of the present invention.

Below the present invention will be explained with reference to the drawings through embodiments in which the present invention is applied to a control system for an automatic transmission,.

FIGS. 1~8 show a first embodiment of the present invention. In the drawings, reference numeral 1 denotes a transmission case of an automatic transmission to be mounted on a vehicle. The transmission case 1 encloses shafts on the input and output sides, a torque converter, various clutch mechanisms and an oil pump (all not shown), and the lower side of the transmission case 1 is closed by an oil pan 2.

Figure 2:
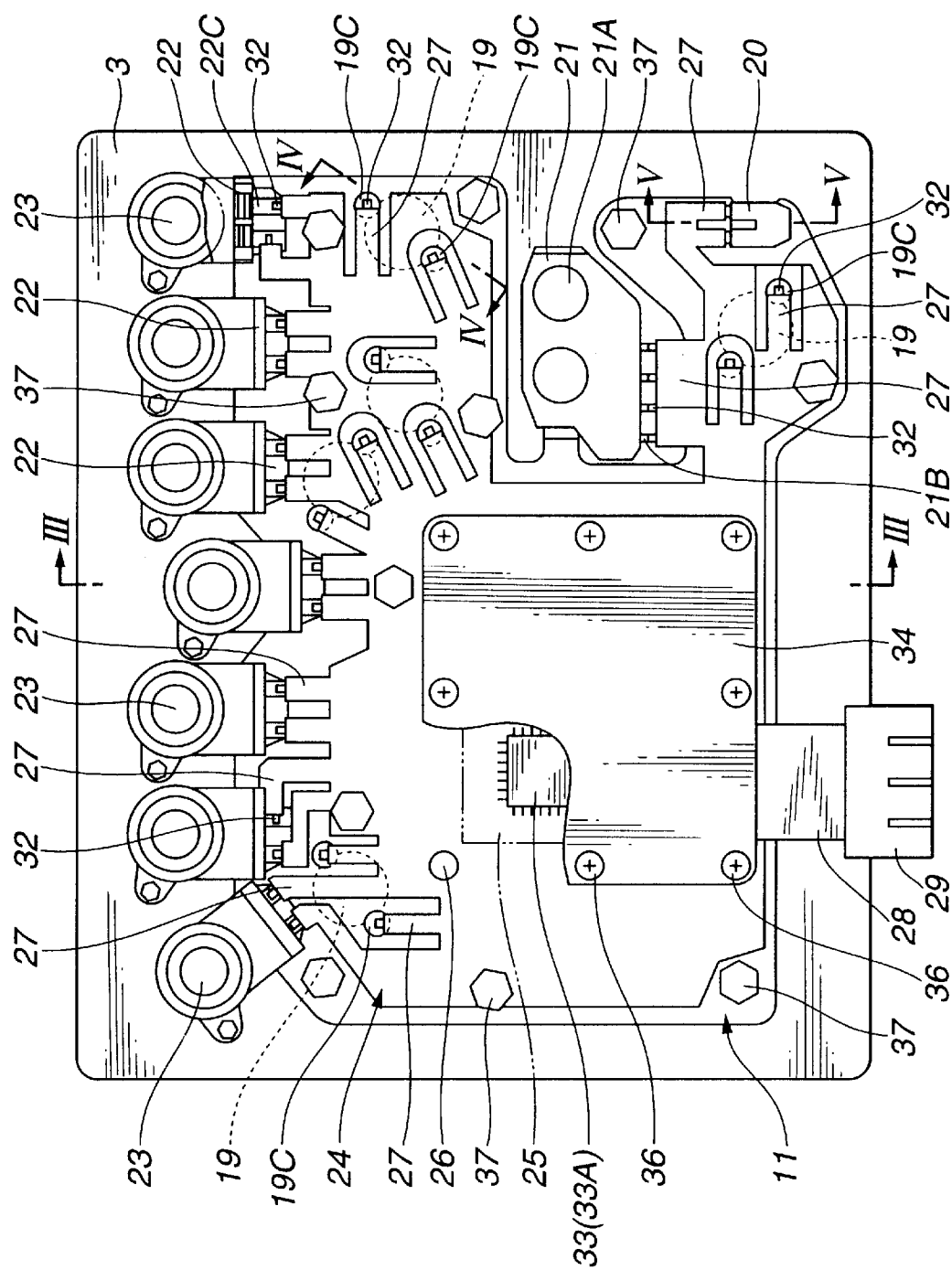
FIG. 2 is a front view showing the control apparatus of FIG. 1, mounted on a control valve.
Figure 3:
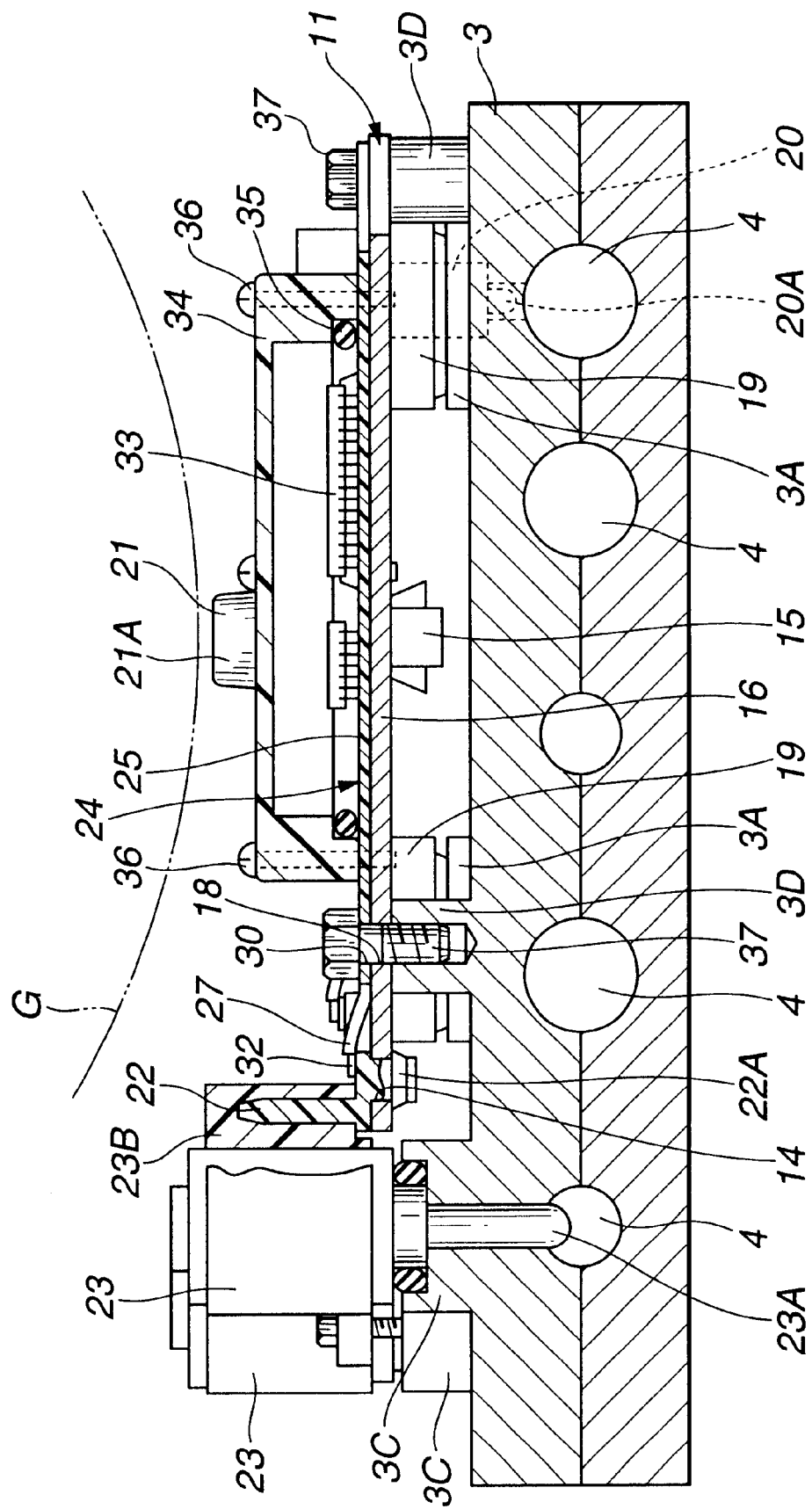
FIG. 3 is a sectional view of the control apparatus and the control valve taken across a line III—III of FIG. 2.

Reference numeral 3 denotes a control valve provided in the transmission case 1. The control valve 3 is attached to the lower side of the transmission case 1 and enclosed in the oil pan 2. The control valve 3 is composed of upper and lower separable parts, as shown in FIGS. 2 and 3. Inside the control valve 3, there are formed a plurality of oil passages 4 to which working fluid is supplied from an oil pump.

Figure 4:
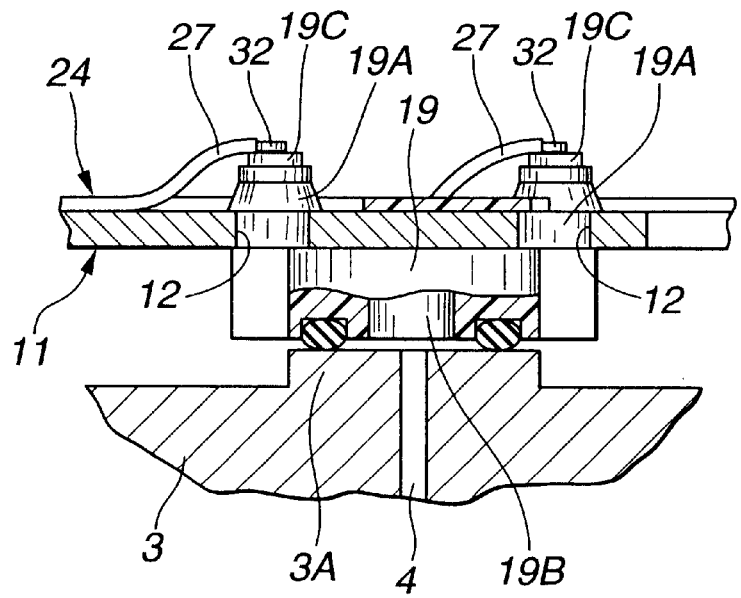
FIG. 4 is an enlarged sectional view taken across a line IV—IV of FIG. 2, for showing an oil pressure sensor.
Figure 5:
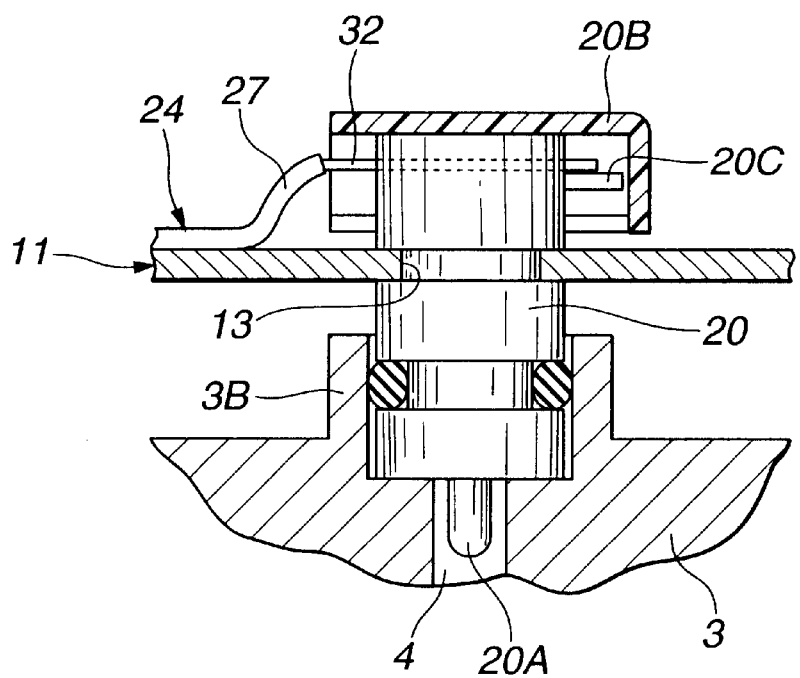
FIG. 5 is an enlarged sectional view taken across a line V—V of FIG. 2, for showing an oil temperature sensor.

As shown in FIGS. 3~5, the control valve 3 is formed with a plurality of boss portions 3A, 3B, 3C and 3D projecting upwardly. Each of the boss portions 3A, 3B and 3C has a hole communicating with one of oil passages 4. Each of the boss portions 3A has an end surface to which one of oil pressure sensors 19 abuts. The boss portion 3B is designed to receive an oil temperature sensor 20 fittingly. Each of the boss portions 3C is designed to receive one of solenoid valves 23 fittingly. Each of the boss portions 3D has a screw hole into which a screw fastener 37 is screwed.

Figure 6:
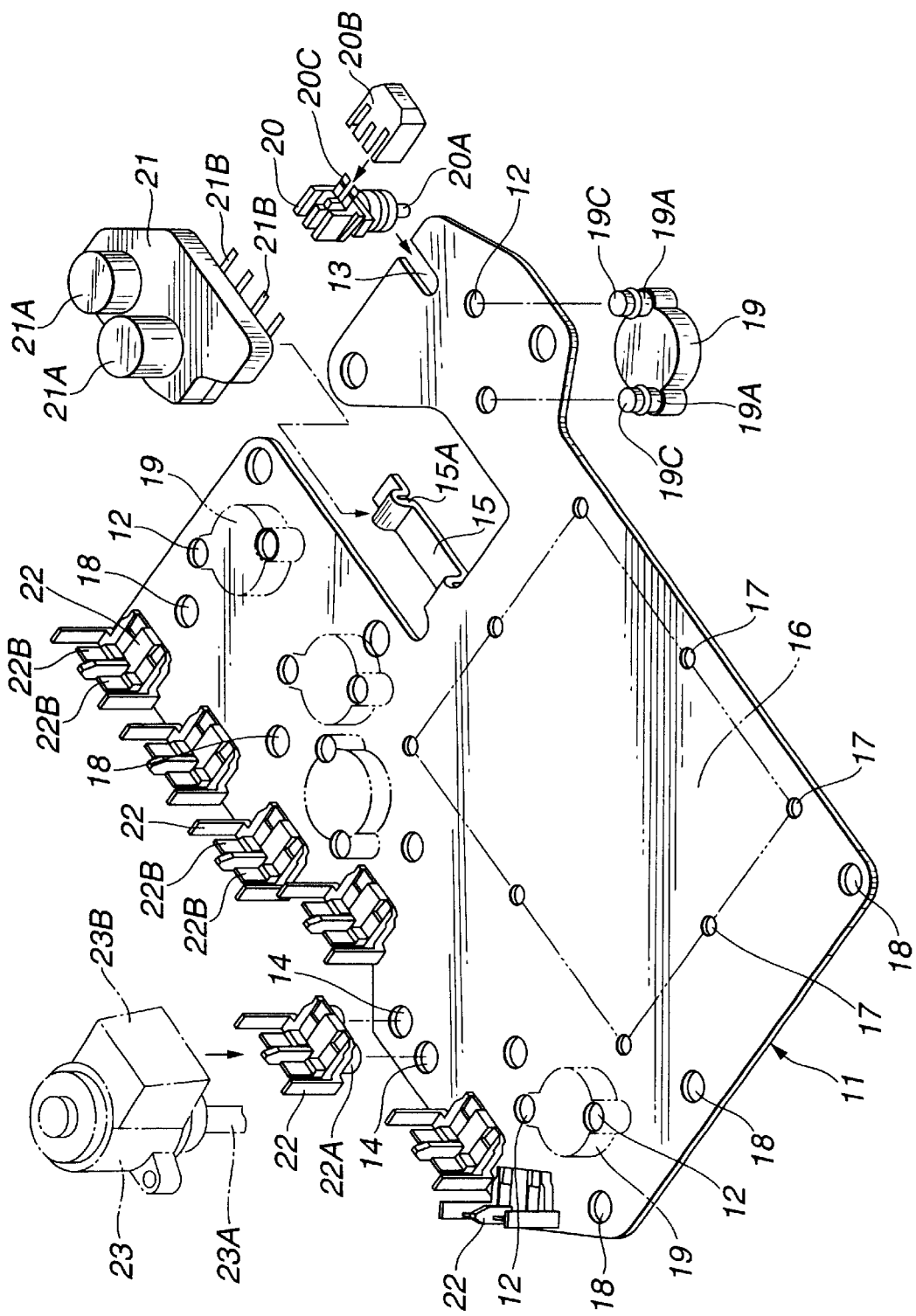
FIG. 6 is an exploded perspective view showing a mounting bracket of the control apparatus of FIG. 1, for supporting various components such as oil pressure sensors, an oil temperature sensor, a rotation sensor, and valve connectors.

A mounting bracket 11 serves as a base for the control apparatus. As shown in FIGS. 3 and 6, the bracket 11 is formed by press-forming of sheet metal, and designed to support oil pressure sensors 19, oil temperature sensor 20, rotation sensor 21, valve connectors 22, an interconnection integrated insulating sheet 24 and a control unit 33. The bracket 11 is attached to the control valve 3 in the assembled state in which these components are preliminarily mounted on the bracket 11. Thus, the mounting bracket 11 supports the control unit 33, and associated input/output devices or associated components forming a control system with the control unit 33.

Therefore, as shown in FIG. 6, the bracket 11 includes a plurality of sensor fitting holes 12 for receiving the oil pressure sensors 19, notched groove 13 for the oil temperature sensor 20, a plurality of connector fitting holes 14 for receiving valve connectors 22 (only two are shown in FIG. 6), and a projecting portion 15 having a U-shaped raised portion 15A for supporting the rotation sensor 21.

The bracket 11 has a rectangular flat circuit receiving portion 16 on which the control unit 33 is disposed. The circuit receiving portion 16 is bordered with a plurality of threaded holes 17 for receiving screw fasteners 36 for a later mentioned protective case 34. The bracket 11 is further formed with a plurality of screw through holes 18 for receiving screw fasteners 37 for the bracket 11.

The oil sensors 19 are oil pressure sensors mounted on the back side of the bracket 11. Each of the oil pressure sensors 19 includes, as shown in FIGS. 4 and 6, for example, two of mounting projections 19A fitted and secured in two of the sensor fitting holes 12 of the bracket 11 respectively, a sensing element 19B for sensing the pressure of the working fluid flowing in one of the oil passages 4 of the control valve 3, and a pair of electrode terminals 19C. Each of the electrode terminals 19C is bared on the upper end of one of the mounting projections 19A and adapted to be connected with one of interconnection patterns 32 of the later-mentioned interconnection integrated insulating sheet 24.

In this example, the mounting projections 19A are made of insulating resin. The projecting end of each mounting projection 19A is forcibly inserted in the corresponding sensor fitting hole 12 with elastic deformation until the inserted end is restored to engage on the surface side of the bracket 11. Each oil pressure sensor 19 is joined up against the corresponding boss portion 3A of the control valve 3 through O-ring. Each oil pressure sensor 19 senses the pressure of the working fluid flowing in the associated oil passage 4 and outputs the detection signals from the electrode terminals 19C.

The oil temperature sensor 20 is mounted on the bracket 11. The oil temperature sensor 20 is fitted in the notched groove 13 of the bracket 11, as shown in FIGS. 5 and 6 so as to clamp the bracket 11, and secured in a manner to prevent extraction. The oil temperature sensor 20 includes a sensing element 20A for sensing the temperature of the working fluid flowing in the adjacent oil passage 4, and a pair of electrode terminals 20C covered with an insulating cover 20B and connected with interconnection patterns 32 of the insulating sheet 24.

The oil temperature sensor 20 is fitted into the boss portion 3B of the control valve 3 through an O-ring, and arranged to sense the temperature of the working fluid flowing in the associated oil passage 4 and output the detection signal from the electrode terminals 20C.

The rotation sensor 21 is provided on the projecting portion 15 of the bracket 11. The rotation sensor 21 includes a metal fitting having a mounting hole on the back side, as shown in FIG. 6. The rotation sensor 21 includes two cylindrical sensing portions 21A encasing a sensing element such as a hall element or magneto-resistive element, and a plurality of electrode terminals 21B connected with interconnection patterns 32 of the interconnection integrated insulating sheet 24.

Moreover, the rotation sensor 21 is formed with a mounting hole on the back side. The rotation sensor 21 is fixed to the sensor fitting raised portion 15A of the bracket 11 by press fit of the sensor fitting raised portion 15A into the mounting hole of the rotation sensor 21. In the state in which the control valve 3 is disposed in the transmission case 1, a gear member G (as shown in FIG. 3) rotating with a shaft of the transmission is disposed in the proximity of the sensing portions 21A. The rotation sensor 21 of this example is arranged to sense the number of revolutions of the gear member G with the sensing portions 21A magnetically, and outputs the detection signal from the electrode terminals 21B.

The valve connectors 22 are mounted on the front surface of the bracket 11 on the upper side as viewed in FIG. 6. Each of the valve connectors 22 includes, for example, two of mounting projections 22A projecting to the lower side of the bracket 11, and a pair of approximately L-shaped electrode terminals 22B, as shown in FIGS. 3 and 6.

The downwardly projecting mounting projections 22A of this example are made of a resin, and fitted fixedly in the connector fitting holes 14 of the bracket 11, respectively, in the same manner as the mounting projections 19A of the oil sensors 19. Each electrode terminal 22B includes an upper portion connected to one of an electrode terminal (not shown) of the later mentioned solenoid valves 23, and a lower portion connected to one of the interconnection patterns 32 of the interconnection integrated insulating sheet 24.

The solenoid valves 23 are provided in the control valve 3. Each of the solenoid valves 23, as shown in FIGS. 2 and 3, includes a rod-shaped valve element 23A for varying the flow rate of the working fluid in the corresponding oil passage 4 in response to a control signal outputted from the control unit 33, and a connecting portion 23B of insulating resin material connected to the corresponding valve connector 22. The solenoid valves 23 are valves for control of the transmission, such as a shift control valve or a lockup control valve.

Figure 7:
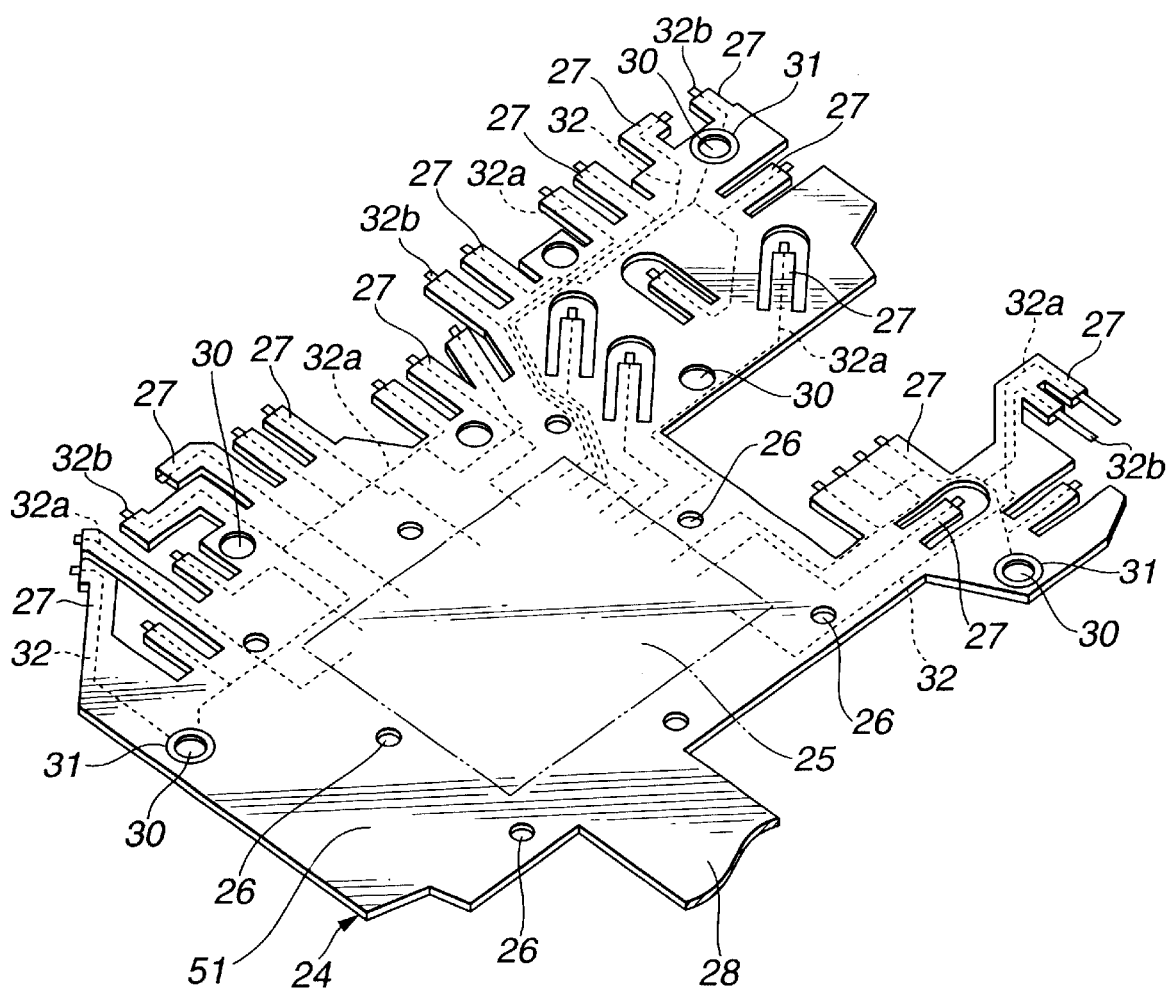
FIG. 7 is a perspective view showing an interconnection integrated insulating sheet of the control apparatus of FIG. 1 in a separate state.

The interconnection integrated insulating sheet 24 is provided on the front surface of the bracket 11. The insulating sheet 24 is one of basic components of the electronic control apparatus according to this embodiment of the invention. The insulating sheet 24 of this example is a flexible multi-layer sheet, as shown in FIG. 7, of alternately superposed thin films of insulating resin material and interconnection patterns 32. Each interconnection pastern 32 is embedded in the insulating sheet 24.

The insulating sheet 24 includes a rectangular control unit mounting portion 25 superposed on the circuit receiving portion 16 of the bracket 11 and a plurality of screw through holes 26 arranged around the control unit mounting portion 25. On the insulating sheet 24, there are further provided a plurality of connecting band portions 27 at the positions corresponding to various mounted associated components such as the oil pressure sensors 19, the oil temperature sensor 20, the rotation sensor 21 and the valve connectors 22 mounted on the bracket 11. The connecting portions 27 are integrated with the control unit mounting portion 25.

Each of the connecting portions 27 is formed in the shape of an elongated band by forming notched grooves or cutting holes in the insulating sheet 24, to have flexibility along the thickness direction of the sheet.

Each connecting portions 27 projects from a main sheet section 51 of the insulating sheet 24. As shown in FIG. 2, the insulating sheet 24 further includes a connecting portion 28 to be connected with an inhibitor switch for detecting the operating position of the shift lever of the vehicle and a vehicle speed sensor for detecting the running speed of the vehicle (neither shown). The connecting portion 28 is provided with a connector 29, as shown in FIG. 2.

The insulating sheet 24 is formed with a plurality of screw through holes 30 substantially at the same positions of screw through holes 18 of the bracket 11, respectively. On the outer circumferential surfaces of some of the screw through holes 30, ring-shaped ground terminals 31 are secured, for grounding to the vehicle body through mounting screw fasteners 37 and the control valve 3.

The insulating sheet 24 is placed on the bracket 11, as shown in FIG. 3. In this overlapped state, the insulating sheet 24 is attached to the control valve 3 together with the bracket 11 by screw fasteners 37.

The interconnection patterns 32 are buried in the insulation sheet 24. Each interconnection pattern 32 is a long conductor made from metal sheet or film. Each interconnection pattern 32 extends along the insulation sheet 24, and is covered with the insulation sheet 24. Some of the interconnection patterns 32 extend from the control unit mounting portion 25 to the connecting portions 27, respectively.

Each interconnection pattern 32 of such a type includes a buried segment 32a buried in the insulating sheet 24, and a bared end portion 32b as shown in FIG. 7. The buried segment 32a has an inner end serving as a part of the control unit 33 at the position of the control unit mounting portion 25. The bared end portion 32b protrudes from the end of the corresponding connecting projecting portion 27.

The bared outer ends of the interconnection patterns 32 are directly connected, respectively, to the electrode terminals 19C, 20C, 21B and 22B of the mounted associated components including the oil pressure sensors 19, the oil temperature sensor 20, the rotation sensor 21 and the valve connectors 22, by means of welding, for example. In the connected state, each connecting portion 27 of the insulation sheet 24 is bent upward, and raised above the bracket 11, as shown in FIG. 3. In this way, these mounted associated components are connected to the control unit 33 by the interconnection patterns 32, respectively. Some of the interconnection patterns 32 are connected to the ground terminals 31 of the insulation sheet 24 to ground the associated components and the control unit 33 to the vehicle body.

Figure 8:
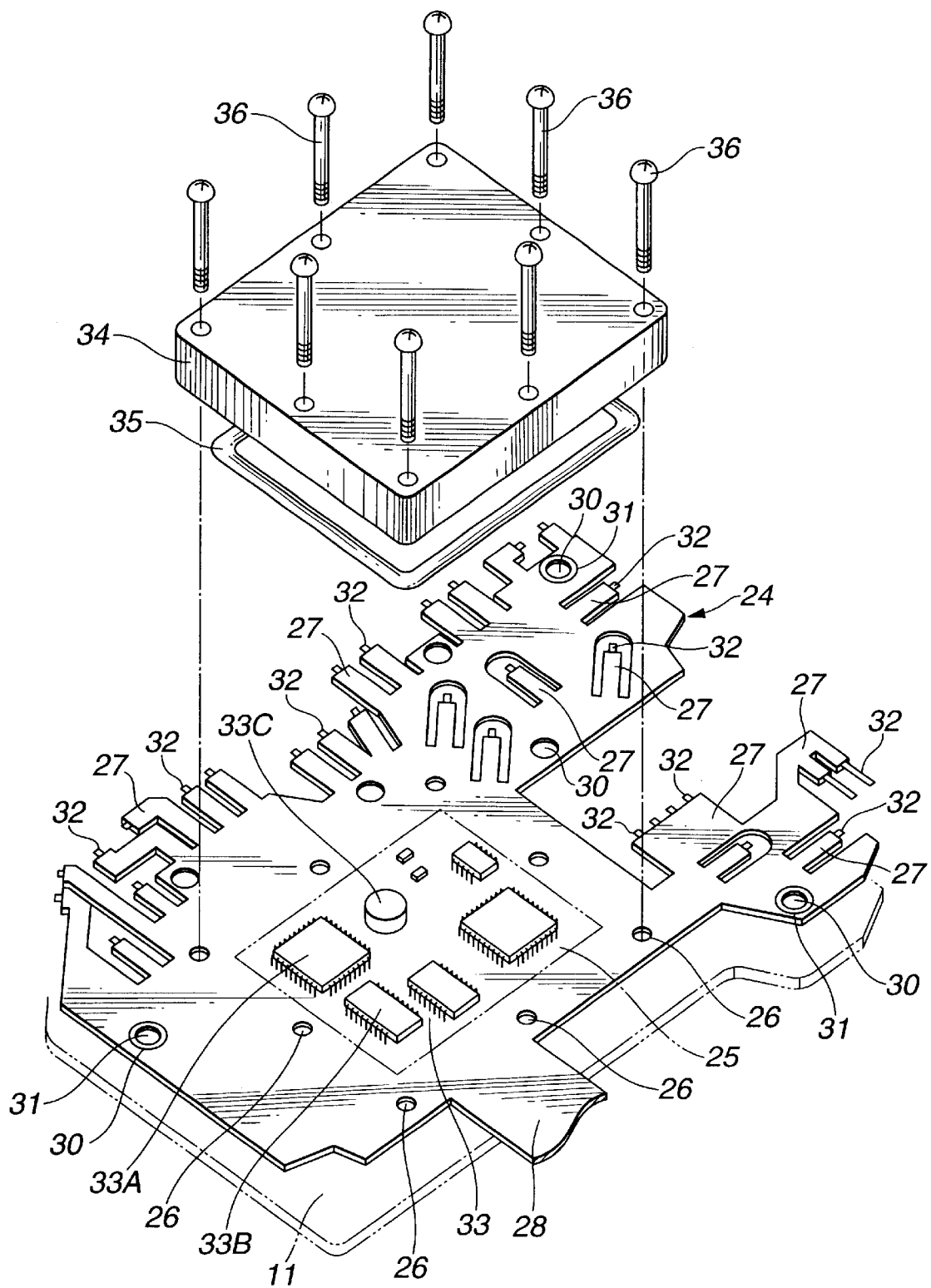
FIG. 8 is an exploded perspective view illustrating an assembly process of the control apparatus of the first embodiment.

The control unit 33 is mounted on the control unit mounting portion 25 of the insulation sheet 24. As shown in FIGS. 3 and 8, the control unit 33 includes a plurality of circuit components 33A, 33B, and 33C mounted on the control unit mounting portion 25 of the insulation sheet 24. These circuit components 33A~33C are connected to each other through the interconnection patterns 32 embedded in the control unit mounting portion 25.

The control unit 33 receives information on the shift position of the shift lever, the engine speed and the vehicle speed, and the signals from the oil pressure sensors 19, the oil temperature sensor 20, and the rotation sensor 21, and controls the shift position of the transmission in accordance with the input information.

The protective cover 34 is a box-shaped member of material such as resin material or metallic material, for covering the control unit 33, as shown in FIG. 8. The protective cover 34 opens downward, and is mounted on the bracket 11 through the insulation sheet 24 by mounting screws 36. The protective cover 34 is equipped with a seal member 35 interposed between the open lower side of the cover 34 and the insulating sheet 24 for sealing therebetween.

In the assembled state, the protective cover 34 protects the control unit 33 from the engine lubricating oil, and prevents the control unit 33 from being short-circuited by metal powder produced by abrasion and contained in the lubrication oil of the engine.

The mounting screws 36 are for fastening the protective cover 34 to the bracket 11. The mounting screws 36 are screwed into the threaded holes 17 of the bracket 11, respectively, through the protective cover 34 and the screw through holes 26 of the insulating sheet 24. The mounting screws 37 are for fixing the bracket 11 to the control valve 3. As shown in FIG. 3, each mounting screw 37 is screwed into one of the boss portions 3D of the control valve 3 through the screw through holes 18 and 30 of the bracket 11 and the insulating sheet 24, respectively.

The thus-constructed automatic transmission control apparatus according to the first embodiment of the present invention is operated as follows.

During running operation of the vehicle, detection signals from the oil pressure sensors 19, the oil temperature sensor 20 and the rotation sensor 21 are supplied to the control unit 33. In accordance with these detection signals, the shift position of the shift lever by a driver, the vehicle speed and the engine speed, the control unit 33 outputs control signals to the solenoid valves 23, and thereby performs the shift control based on the operating conditions of the vehicle.

In assemblage of the control apparatus, the circuit components 33A, 33B and 33C of the control unit 33 are mounted on the control unit mounting portion 25 of the insulating sheet 24, and the mounted associated components including the oil pressure sensors 19, the oil temperature sensor 20, the rotation sensor 21 and the valve connectors 22 are mounted on the bracket 11 at respective positions.

Next, the insulating sheet 24 equipped with the control unit 33 is placed on the bracket 11, and the interconnection patterns 32 are connected with the electric terminals 19C, 20C, 21B and 22B by welding, respectively. On the bracket 11, the protective cover 34 is mounted through the insulating sheet 24 so as to cover the control unit 33.

Thereby, the oil pressure sensors 19, the oil temperature sensor 20, the rotation sensor 21, the valve connectors 22, the insulating sheet 24 and the control unit 33 are integrated onto the bracket 11. Then, the bracket 11 is attached on the control valve 3 by tightening the mounting screws 37 and the solenoid valves 23 are connected to the valve connectors 22, respectively.

In this embodiment, the control unit 33 is mounted on the interconnection integrated insulating sheet 24 on the bracket 11, and connected with the mounted associated components including the oil pressure sensors 19, the oil temperature sensor 20, the rotation sensor 21 and the valve connectors 22 by interconnection patterns 32 buried in the insulating sheet 24. Therefore, only by providing the circuit component 33A, 33B, and 33C on the insulating sheet 24, it is possible to integrate the control unit 33 and the interconnection patterns 32 into a single unit.

Consequently, this arrangement according to the present invention eliminates the need of connecting a lot of lead wires with the control unit 33, and the integrated unit of the control unit 33 and the insulating sheet 24 is installed on the control valve 3 by the bracket 11 efficiently.

This arrangement according to the present invention further eliminates the need for support members for the control unit and leads as well as connectors and leads employed in the conventional method are omitted. Therefore, the number of required component parts is reduced, and the workability on assembly is improved. Moreover, the thin insulating sheet 24 is advantageous for size reduction of the whole system including the control unit 33 and mounted associated components.

The bared portions of the interconnection patterns 32 protruding from connecting portions 27 of the insulating sheet 24 can be directly connected to the mounted associated components. This connection structure between these mounted associated components and the control unit 33 is simple and effective to improve the durability and the reliability.

The need of collecting interconnecting lines on the connector's side as in a conventional control unit is eliminated, so the interconnection patterns 32 can be disposed at any place around the control unit 3 (control unit mounting portion 25) on the insulating sheet 24 and the pattern is freely designed according to the need. Therefore, the interconnection patterns 32 can be readily adapted to any changes in the design of the control system.

Moreover, the interconnection patterns 32 embedded in the resin insulating sheet 24 are protected by the resin material of the insulating sheet 24. The flexible connecting band portions 27 of the insulating sheet 24 facilitates the connection of the interconnection patterns 32 with mounted associated components, and thereby improves the workability in the connecting operations. The overlay structure of the insulating sheet 24 on the bracket 11 can reinforce the insulating sheet 24 and can fix the insulating sheet 24 and the bracket 11 on the control valve 3 stably.

Further, the insulating sheet 24 and the bracket 11 are fixed on the control valve 3 by the mounting screws 37, so the interconnection patterns 32 can be easily grounded to the vehicle body through the mounting screws 37 and the control valve 3.

The oil pressure sensors 19, the oil temperature sensor 20, the rotation sensor 21 and the valve connectors 22 are mounted on the bracket 11. Therefore, these mounted parts, the insulating sheet 24 and the control unit 33 are easily integrated by the bracket 11, and the control apparatus can be efficiently mounted on the control valve 3 as a subassembly.

Since mounting projections 19A are provided to the oil pressure sensors 19 and mounting projections 22A CD are provided to the valve connectors 22, the oil pressure sensors 19 and the valve connectors 22 can be easily fixed into the bracket 11, by inserting the mounting projections 19A and 22A forcibly into the fitting holes 12 and 14, respectively.

Unlike the structure in which the rotation sensor 21 is mounted to a transmission case, the rotation sensor 21 is mounted to the bracket 11 by the sensor fitting projection 15A (of the projecting portion 15) in this embodiment, so the mounting structure and the shape of the transmission case 1 can be simplified.

Figure 9:
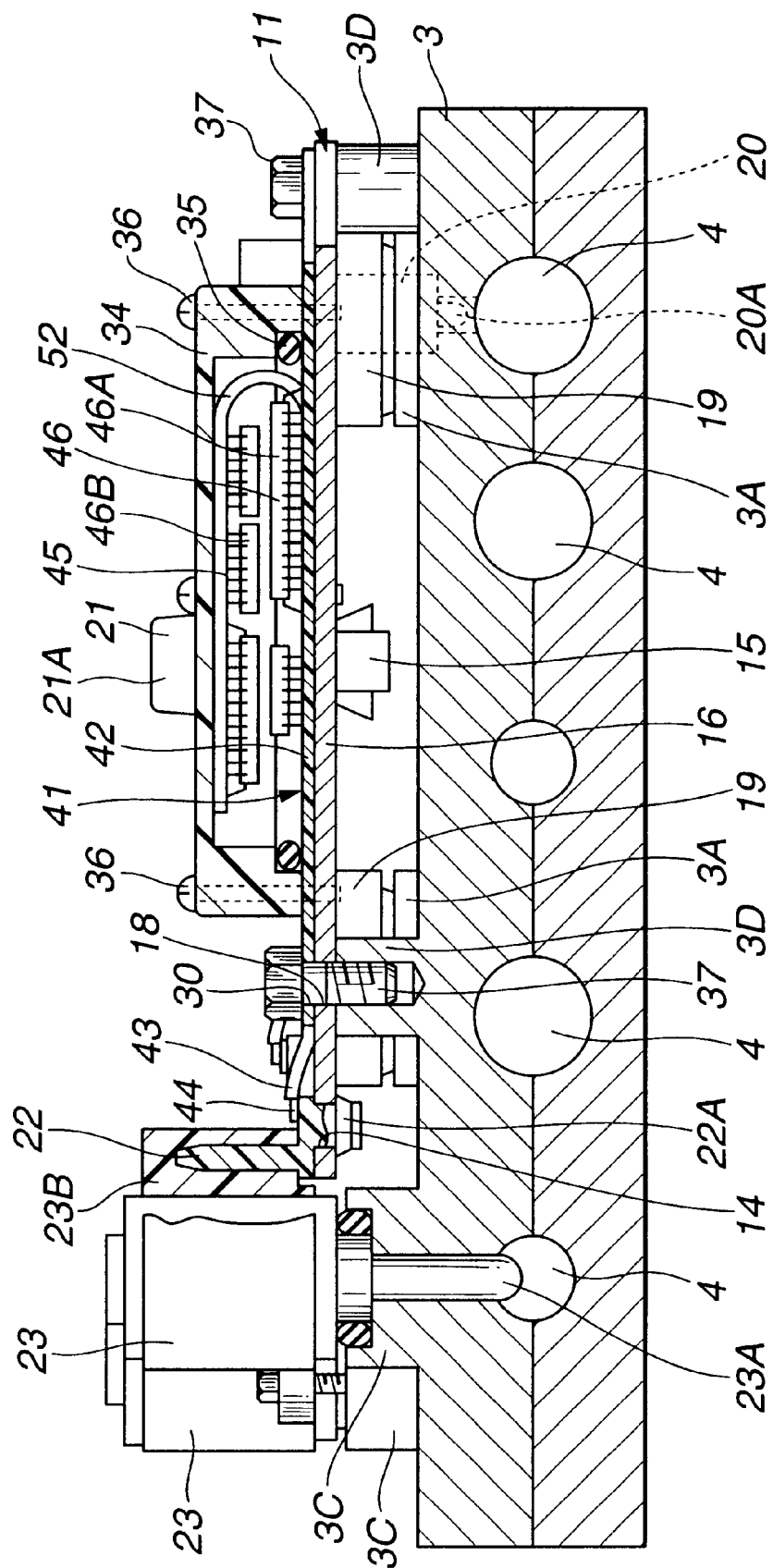
FIG. 9 is a sectional view showing a control apparatus according to a second embodiment of the present invention.
Figure 10:
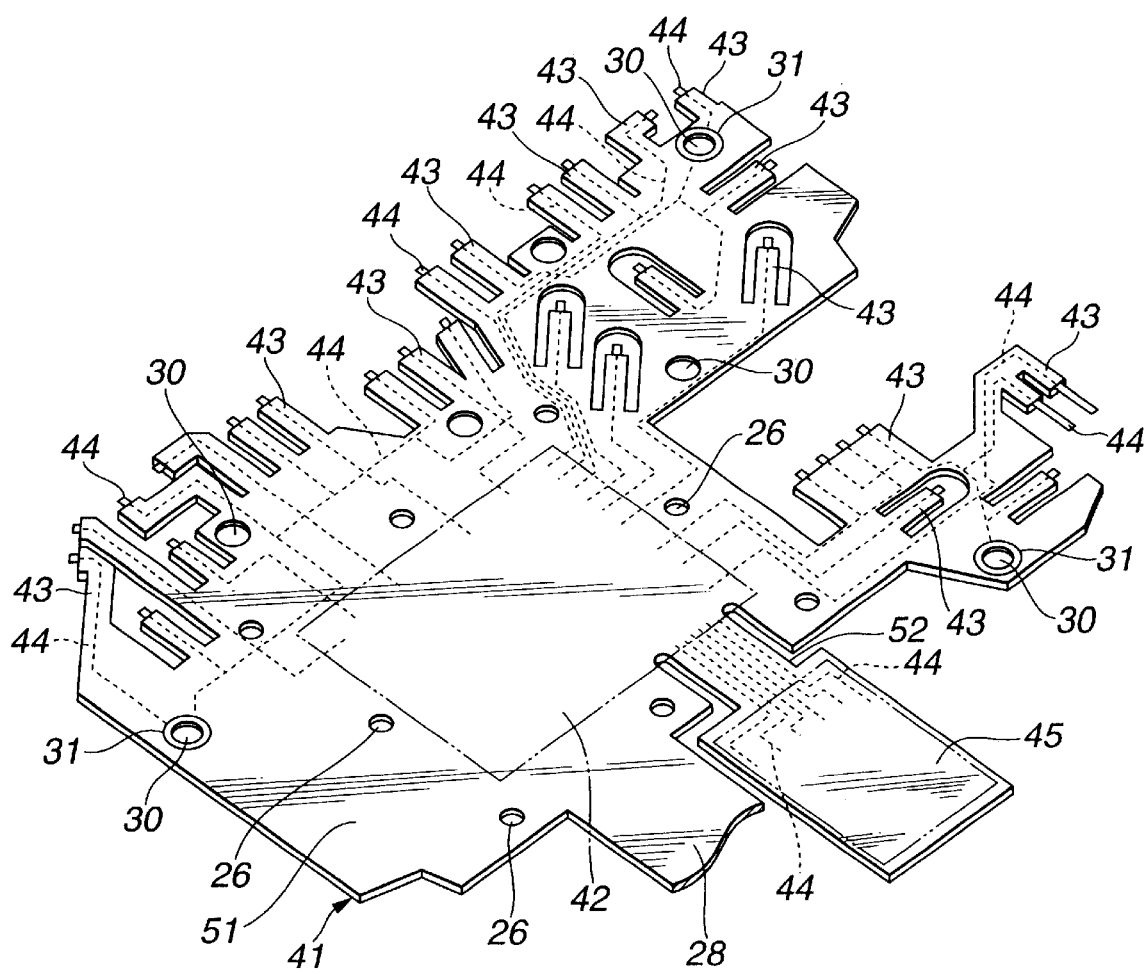
FIG. 10 is a perspective view showing an interconnection integrated insulating sheet of FIG. 9, separately.

FIGS. 9 and 10 show a second embodiment of the present invention. The feature of the second embodiment resides in the arrangement such that an extended sheet section is provided on the inner side of the protective cover, in confrontation to the interconnection integrated insulating sheet. The second embodiment is almost the same as the first embodiment, so that a detailed description on the same parts will be omitted by simply adding the same reference numerals.

Reference numeral 41 denotes an interconnection integrated insulating sheet according to the second embodiment. The insulating sheet 41 includes a main sheet section 51, an extended sheet section 45 projecting from the main section 51, and a connecting section 52 connecting the extended sheet section 45 with the main sheet section 51. Like the insulating sheet 24 of the first embodiment, the main sheet section 51 of the insulating sheet 41 includes a control unit mounting portion 42, connecting band portions 43 and interconnection patterns 44 embedded therein.

The extended sheet section 45, the connecting sheet section 52 and the main sheet section 51 are integral parts of the single insulating sheet 41. The extended sheet section 45 project from the control unit mounting portion 42 outwardly like the connecting portion 28, and interconnection patterns 44 extending from the control unit mounting portion 42 are embedded therein. In the assembled state shown in FIG. 9, the connecting sheet section 52 is bent in the U-shaped form, and the extended sheet section 45 is mounted on the inner side of the protective cover 34. In the assembled state, the extended sheet section 45 is located just above the control unit mounting portion 42 of the main sheet section 51, in confrontation to the control unit mounting portion 42.

Reference numeral 46 denotes a control unit mounted on the insulating sheet 41. The control unit 46 includes at least one circuit component 46A mounted on the control unit mounting portion 42 of the main sheet section 51 and at least one circuit component 46B mounted on the extended sheet portion 45. As viewed in FIG. 9, the circuit component 46A is mounted on an upwardly facing confronting surface of the main sheet section 51 whereas the circuit component 46B is mounted on a downwardly facing confronting surface of the extended sheet section 45.

The thus-constructed second embodiment can provide similar effects as in the first embodiment. The addition of the extended sheet section 45 increases the area for packaging the control unit 46, makes it possible to employ a control unit having a larger number of circuit components 46A and 46B or a control unit having components of higher capacity, and enhances the design freedom of the control unit 46. Moreover, the extended sheet section 45 is installed compactly in the protective cover 34 in a folding manner, and one or more circuit components 46B can be added in the inside space of the protective cover 34 without increasing the overall size.

Although the invention has been described above with reference to certain embodiments of the invention, the invention is not limited to the embodiments described above. Modifications and variations of the embodiments described above will occur to those skilled in the art in light of the above teachings.

While the bracket 11 is formed by a sheet metal in the aforementioned embodiments, a hard resin board, for example, may be employed alternatively to form the bracket.

Further, while the oil pressure sensors 19, the oil temperature sensor 20, the rotation sensor 21, the valve connectors 22, and the control unit 33 are mounted on the bracket 11 in the aforementioned embodiments, any sensors for sensing operating conditions of an automatic transmission and a variety of electronic circuits for controlling a transmission may be mounted on the bracket 11.

The present invention is not limited to the electronic control apparatus for a transmission. The present invention is applicable to an electronic control system for an engine, or any other electronic control system to be installed in a vehicle.

This application is based on a prior Japanese Patent Application No. 2000-195062. The entire contents of the Japanese Patent Application No. 2000-195062 with a filing date of Jun. 28, 2000 in Japan are hereby incorporated by reference.

The scope of the invention is defined with reference to the following claims.

What is claimed is:

1. An electronic control apparatus for a vehicle, the control apparatus comprising:
   a control unit;
   a plate-shaped bracket adapted to be installed in the vehicle; and
   an interconnection integrated insulating sheet interposed between the bracket and the control unit, the insulating sheet comprising a plurality of interconnection patterns connected with the control unit;
   wherein the interconnection integrated insulating sheet includes a control unit mounting portion which is sandwiched between the bracket and the control unit, and the control unit is separated from the bracket by the control unit mounting portion.

2. The electronic control apparatus as claimed in claim 1, wherein the insulating sheet comprises an insulating layer of insulating resin, and the interconnection patterns are buried in the insulating layer.

3. The electronic control apparatus as claimed in claim 1, wherein the control apparatus further comprises a plurality of associated components each connected with the control unit through one of the interconnection patterns.

4. The electronic control apparatus as claimed in claim 1, wherein the bracket comprises a portion for attaching the bracket to a control valve to control an automatic transmission of the vehicle.

5. The electronic control apparatus as claimed in claim 4, wherein the control unit is a component of a control circuit to control the automatic transmission; the control apparatus further comprises an oil sensor to sense an oil condition of an operating oil flowing in the control valve, and a valve connector for a solenoid valve to control a flowing condition of the operating oil; and each of the oil sensor and the valve connector is connected with the control unit by one of the interconnection patterns.

6. The electronic control apparatus as claimed in claim 1, wherein the control unit is mounted on the insulating sheet and the insulating sheet is fixed to the bracket by a fastening device.

7. The electronic control apparatus as claimed in claim 1, wherein the control apparatus further comprises a protective cover to cover the control unit; and the protective cover is mounted on the insulating sheet.

8. The electronic control apparatus as claimed in claim 1, wherein the interconnection integrated insulating sheet comprises a main sheet section and an extended sheet section projecting from the main sheet section, and the control unit comprises a first circuit component mounted on the main sheet section and a second circuit component mounted on the extended sheet section.

9. An electronic control apparatus for a vehicle, the control apparatus comprising:
    a control unit;
    a plate-shaped bracket adapted to be installed in the vehicle; and
    an interconnection integrated insulating sheet interposed between the bracket and the control unit, the insulating sheet comprising a plurality of interconnection patterns connected with the control unit;
    wherein the interconnection integrated insulating sheet comprises a main sheet section and an extended sheet section projecting from the main sheet section, and the control unit comprises a first circuit component mounted on the main sheet section and a second circuit component mounted on the extended sheet section; and
    wherein the interconnection integrated insulating sheet further comprises a connecting sheet section extending from the main sheet section to the extended sheet section; the connecting sheet section is bent in a U-shaped form; and the extended sheet section is located over the main sheet section.

10. The electronic control apparatus as claimed in claim 9, wherein the main sheet section comprises a confronting surface on which the first circuit component is mounted; the extending sheet section comprises a confronting surface on which the second circuit component is mounted; and the confronting surfaces of the main sheet section and the extended sheet section confront each other.

11. The electronic control apparatus as claimed in claim 10, wherein the control apparatus further comprises a protective cover enclosing the control unit on the insulating sheet; and the extended sheet section is placed in the protective cover and supported by the protective cover.

12. An electronic control apparatus for a vehicle, the control apparatus comprising:
    a control unit;
    a plate-shaped bracket adapted to be installed in the vehicle; and
    an interconnection integrated insulating sheet interposed between the bracket and the control unit, the insulating sheet comprising a plurality of interconnection patterns connected with the control unit;
    wherein the control apparatus further comprises a plurality of associated components each connected with the control unit through one of the interconnection patterns; and
    wherein the interconnection integrated insulating sheet comprises a main sheet section on which the control unit is mounted, and a plurality of flexible insulating band portions each projecting from the main sheet section to a band end;
    a bared conductor end is protruded from the band end of each flexible insulating band portion, and electrically connected with one of the associated components; and the bared conductor end is an end of one of the interconnection patterns.

13. The electronic control apparatus as claimed in claim 12, wherein the flexible insulating band portions are curved, and the band end of each flexible insulating band portion is raised separately from the bracket.

14. A control apparatus for a vehicle, the control apparatus comprising:
    a control unit;
    a plurality of associated components forming a control system for the vehicle with the control unit;
    a plate-shaped bracket supporting the control unit, and the associated components; and
    an interconnection integrated insulating sheet interposed between the bracket and the control unit, the insulating sheet comprising an insulating layer, and a plurality of interconnection patterns buried in the insulating layer, each of the interconnection patterns connecting the control unit electrically with one of the associated components;
    wherein the interconnection integrated insulating sheet further comprises a plurality of flexible insulating projecting portions projecting from the insulating layer, and each interconnection pattern comprises a buried segment buried in the insulating layer, and a bared end portion which projects from one of the flexible projecting portions and which is connected with one of the associated components.

15. The electronic control apparatus as claimed in claim 1, wherein the plate-shaped bracket is formed with a plurality of through holes, and the interconnection integrated insulating sheet is formed with a plurality of through holes each of which is aligned with a unique one of the through holes of the bracket to receive a fastener.

* * * * *